(12) United States Patent
Rabanos et al.

(10) Patent No.: US 9,368,001 B2
(45) Date of Patent: Jun. 14, 2016

(54) DEVICE FOR HANDLING BANKNOTES

(71) Applicant: Wincor Nixdorf International GmbH, Paderborn (DE)

(72) Inventors: Rophie Rabanos, Singapore (SG); Hengky Wirawan, Singapore (SG); Lutz Bernhard, Delbrueck (DE)

(73) Assignee: Wincor Nixdorf International GmbH (DE)

( * ) Notice: Subject to any disclaimer, the term of this patent is extended or adjusted under 35 U.S.C. 154(b) by 0 days.

(21) Appl. No.: 14/683,318

(22) Filed: Apr. 10, 2015

(65) Prior Publication Data

US 2015/0213693 A1    Jul. 30, 2015

Related U.S. Application Data

(63) Continuation of application No. 13/654,777, filed on Oct. 18, 2012, now abandoned.

(30) Foreign Application Priority Data

Oct. 21, 2011    (EP) .................................... 11186148

(51) Int. Cl.
*G07F 19/00* (2006.01)
*H05K 5/00* (2006.01)
*H05K 5/02* (2006.01)

(52) U.S. Cl.
CPC ............ *G07F 19/205* (2013.01); *H05K 5/0017* (2013.01); *H05K 5/0217* (2013.01)

(58) Field of Classification Search
None
See application file for complete search history.

(56) References Cited

U.S. PATENT DOCUMENTS

| | | | |
|---|---|---|---|
| 3,789,140 A | 1/1974 | McQueen et al. |
| 6,131,874 A | 10/2000 | Vance et al. |
| 6,296,079 B1 | 10/2001 | McNaughton |
| 6,812,917 B2 | 11/2004 | Jenkins et al. |
| 7,644,039 B1 | 1/2010 | Magee et al. |
| 7,712,657 B1 | 5/2010 | Block et al. |
| 7,744,039 B2 | 6/2010 | Miles et al. |
| 7,812,892 B2 | 10/2010 | Yoon |

(Continued)

FOREIGN PATENT DOCUMENTS

| | | |
|---|---|---|
| AT | 11103 U1 | 4/2010 |
| CN | 201689608 U | 12/2010 |

(Continued)

OTHER PUBLICATIONS

John N. Porter, 2 page letter addressed to Commissioner for Patents and 12 page "claim charts" (dated Feb. 21, 2014).

(Continued)

*Primary Examiner* — Jason Olson
*Assistant Examiner* — Krishna Neupane
(74) *Attorney, Agent, or Firm* — Harness, Dickey & Pierce, P.L.C.

(57) ABSTRACT

The invention relates to a device for handling banknotes. The device comprises a display unit having a display surface for displaying at least one graphical user interface. Moreover, the device comprises a drive unit for tilting the display unit about the axis of rotation. The display unit is connected to a gear segment formed along a circular arc, the axis of rotation extending through the center of curvature of the circular arc. A gear which is operatively connected to the drive unit engages with the teeth of the gear segment formed along the circular arc.

20 Claims, 5 Drawing Sheets

(56) References Cited

U.S. PATENT DOCUMENTS

| | | | |
|---|---|---|---|
| 8,269,903 B2* | 9/2012 | Handa | B60R 11/0235 296/70 |
| 8,432,476 B2 | 4/2013 | Ashforth et al. | |
| 8,714,448 B2 | 5/2014 | Lutz | |
| 2002/0024488 A1 | 2/2002 | Jenkins et al. | |
| 2005/0264529 A1 | 12/2005 | Morgan et al. | |
| 2006/0151596 A1 | 7/2006 | Scanlon | |
| 2006/0203013 A1* | 9/2006 | Chuo | B60R 11/0235 345/649 |
| 2008/0025529 A1 | 1/2008 | Keohane et al. | |
| 2009/0218203 A1 | 9/2009 | Taverner | |
| 2010/0108844 A1* | 5/2010 | Ogawa | B60R 11/0235 248/274.1 |
| 2010/0126805 A1* | 5/2010 | Oh | G07F 19/20 186/37 |
| 2012/0192770 A1* | 8/2012 | Guan | G07D 11/0018 109/66 |
| 2012/0223135 A1 | 9/2012 | Meek et al. | |

FOREIGN PATENT DOCUMENTS

| | | |
|---|---|---|
| CN | 201984577 U | 9/2011 |
| EP | 1047029 A2 | 10/2000 |
| EP | 1016950 B1 | 5/2003 |
| WO | WO-02-071315 A2 | 9/2002 |
| WO | WO-2009-023782 A1 | 2/2009 |

OTHER PUBLICATIONS

John N. Porter, Third Party Submission Under 37 CFR 1.290 and Concise Description of Relevance mailed Mar. 18, 2014 (16 pages).

Third Party Submission Under 37 CFR 1.290 from U.S. Appl. No. 13/654,728 and Concise Description of Relevance dated Mar. 18, 2014 (13 pages).

* cited by examiner

DEVICE FOR HANDLING BANKNOTES

CROSS-REFERENCE TO RELATED APPLICATIONS

This is a continuation patent application of U.S. application Ser. No. 13/654,777 filed Oct. 18, 2012, which claims priority to European Patent Application No. 11 186 148.0, filed Oct. 21, 2011, both of which are expressly incorporated by reference herein in their entireties.

BACKGROUND OF THE INVENTION

1. Technical Field

The invention relates to a device for handling banknotes, which comprises a display unit having a display surface for displaying at least one graphical user interface to a user of the device.

2. Discussion

The device is in particular an automated teller machine by means of which banknotes can be dispensed to a user and/or banknotes can be deposited by the user. At least one graphical user interface via which the user can control operating functions of the device is displayed to the user by means of a display unit. In particular, via such a graphical user interface the user is requested to carry out the individual steps required for the deposit and/or the withdrawal of banknotes.

These automated teller machines are used by people of different heights such as, for example, a person sitting in a wheel chair. Further, automated teller machines are known that can be used from inside a vehicle, wherein these vehicles can have very different seat heights. A display unit that is firmly connected to the automated teller machine is optimally oriented for only one face position and, for reasons of security, the graphical user interfaces displayed by the display unit can only be viewed from a limited angle. Therefore, the use of such automated teller machines by users whose face position, due to their height, differs from the optimum face position requires effort.

From U.S. Pat. No. 7,644,039 B1, U.S. Pat. No. 6,812,917 B2, US 2010/0126805 A1 and U.S. Pat. No. 6,296,079 B1, devices with tiltable display surfaces are known.

SUMMARY OF THE INVENTION

It is an object of the invention to specify a device for handling banknotes, in which the orientation of a display unit can easily be changed.

The device for handling banknotes comprises a display unit having a display surface for displaying at least one graphical user interface, the display unit being rotatably mounted about an axis of rotation for changing the tilt of the display surface. Further, the device comprises a drive unit for rotating the display unit about the axis of rotation. The display unit is preferably stationarily connected to a gear segment formed along a circular arc, the axis of rotation extending through the center of curvature of the circular arc. By the stationary connection between the display unit and the teeth of the gear segment formed along the circular arc the display unit is moved together with the teeth of the gear segment.

A gear coupled to the drive unit engages with the teeth of the gear segment formed along the circular arc. This allows for a mechanically simple structure with which a tilt angle of the display surface of the display unit can be adjusted in a stepless and easy manner. Moreover, as only rotational movements are provided, the structure is low-maintenance and robust.

Preferably, the device comprises at least one further operating element by means of which a tilt angle can be adjusted. As a result thereof, users can adjust their preferred display unit tilt angle.

In an advantageous development of the further operating element, this operating element comprises a first push button for driving the display unit about the axis of rotation in a first direction of rotation and a second push button for driving the display unit about the axis of rotation in a second direction of rotation opposite to the first direction of rotation. By providing two separate push buttons, each push button can, for example, be assigned one pictogram that corresponds to the effect of a use of this push button on the tilt angle of the display unit. This makes it easier for the users to adjust their preferred display unit tilt angle. As an alternative or in addition to the pictogram, singles letters or a text can be provided on each push button, these letters or the text indicating the effect of the use of this push button on the tilt angle of the display unit.

In a preferred embodiment, the display unit comprises a rectangular display surface. This display surface has a first side with a first side length and a second side with a second side length, the first side and the second side enclosing a right angle. A rectangular display surface is the preferred format of a display surface for automated teller machines. With this design of the display surface, standardized user interfaces for automated teller machines can be used.

In a particularly preferred embodiment of the device, this first side is oriented horizontally. In this way, the users can particularly easily view the graphic user interfaces.

It is advantageous when a plurality of push buttons for selecting control information displayed via the user interface are arranged along the second side of the display surface and/or along a third side of the display surface opposite to the second side. By arranging these push buttons next to the display surface in the display unit, these push buttons are likewise tilted when the display unit is tilted about the axis of rotation so that they are always arranged in the same position relative to the display surface. In this way, the control information on the user interface can always be displayed in the same position on the display surface independent of the tilt angle.

In a preferred embodiment, the axis of rotation is oriented horizontally when the device is in the operating position. This allows for a particularly easy orientation of the display unit relative to the user.

It is advantageous when the device comprises a control unit in which a home position tilt angle is stored in a preset manner. The control unit controls the drive unit such that this home position tilt angle is adjusted whenever a transaction initiated by the user is terminated. By providing a home position tilt angle, the display unit and thus the display surface is in a home position when the device is not used. For example, a tilt angle that is to be adjusted particularly often is assigned to this home position. As a result thereof, particular short adjustment times are achieved.

In a particularly preferred embodiment, the display unit comprises a touch screen. As a result thereof, use of the device is particularly easy. Further, the user interfaces for operating the device can have a simple design and allow for easy navigation.

Further features and advantages of the invention result from the following description which, in connection with the enclosed Figures, explains the invention in more detail with reference to embodiments.

DESCRIPTION OF THE PREFERRED EMBODIMENTS

Figure 1:
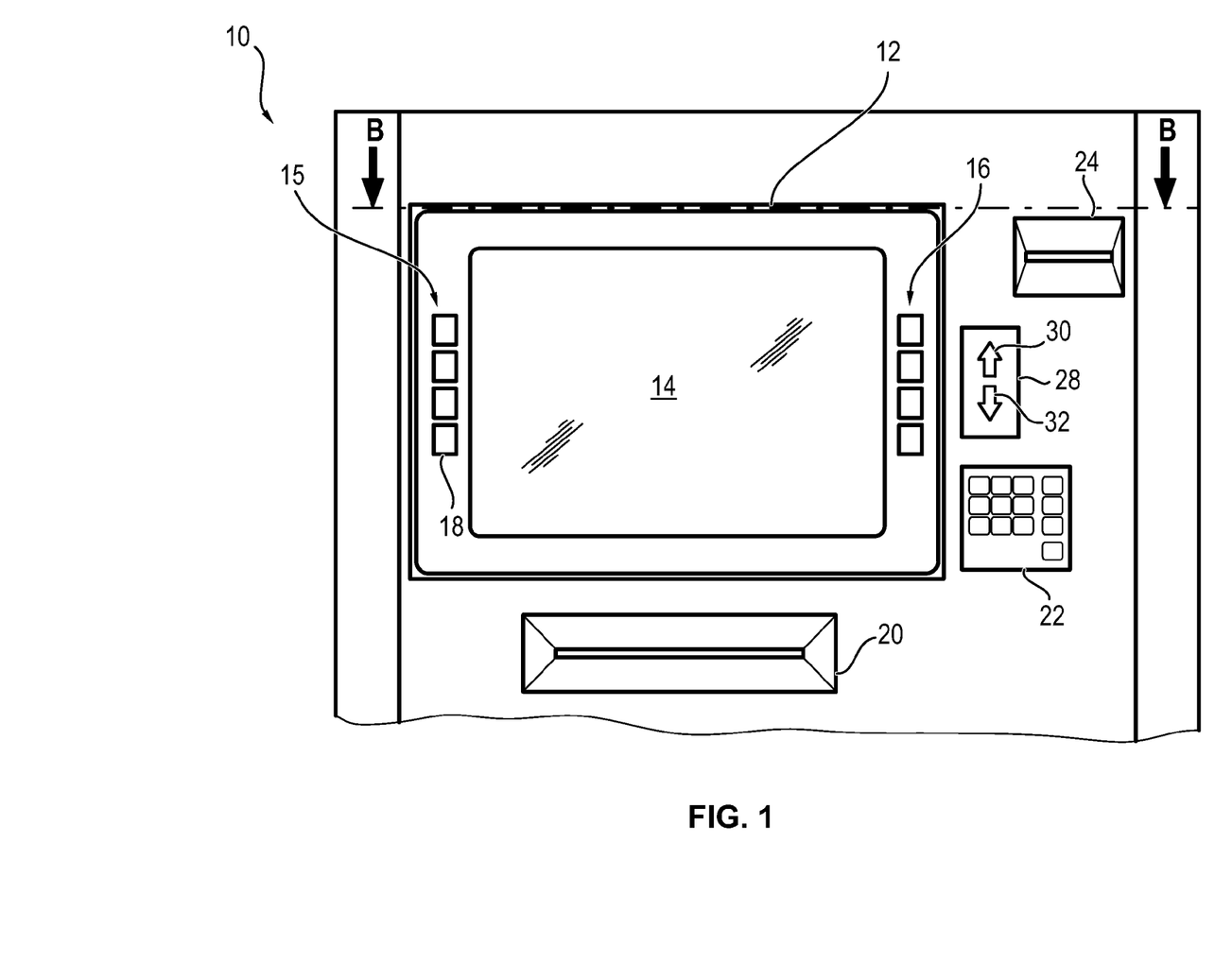
FIG. 1 shows a front view of a part of a device for handling banknotes.

FIG. 1 shows a front view of an upper part of a device 10 for handling banknotes. This part comprises operating elements of an operating panel, by which a user operates the device 10. These operating elements comprise an input and output slot 20 for banknotes, a keypad 22 which, for example, serves to enter a PIN, a card reader 24 for a magnetic stripe and/or chip card as well as a tiltable display unit 12. In this embodiment, this display unit 12 comprises a display surface 14 and is designed as an LCD display. But the invention is not limited to an LCD display. Moreover, the display unit 12 comprises two push button panels 15, 16 with four push buttons each, one push button being exemplarily identified with the reference sign 18. Via these push buttons 18, a user can input information. Different functions may be assigned to these push buttons dependent on a displayed graphical user interface.

The device 10 comprises an operating element 28 via which a user can manually change the tilt angle of the display unit 12. In this embodiment, the operating element 28 is designed as a rocker switch, the two pictograms 30, 32 provided on the rocker switch indicating the operating function of the respective area of the rocker switch.

Figure 2:
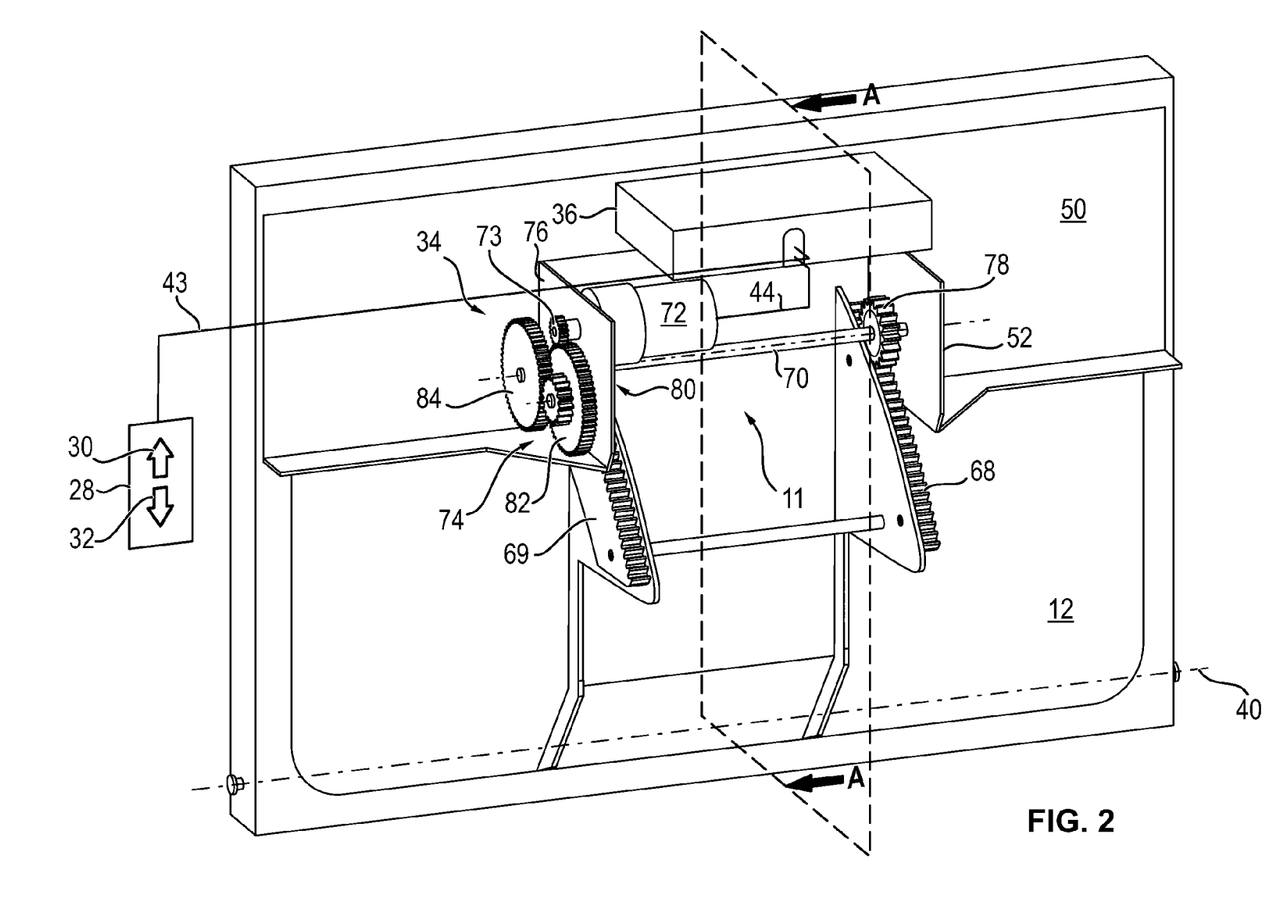
FIG. 2 shows a schematic perspective rear view of an arrangement with a display unit and with a drive unit for changing the tilt angle of the display unit.

FIG. 2 shows a schematic perspective rear view of an arrangement 11 for tilting the display unit 12 of the device 10 according to FIG. 1. Apart from the display unit 12, the arrangement 11 comprises a drive unit 34. By means of the drive unit 34, the tilt angle of the display unit 12 can be changed. In FIG. 2, apart from the arrangement 11, the operating element 28 is illustrated which is connected via a schematically illustrated electric line 43 to a control unit 36. The display unit 12 is tiltable about an axis of rotation 40 by means of the drive unit 34.

The drive unit 34 comprises a drive motor 72 which by means of a gear 73 drives a gear unit 74 comprising a stepped gear 82 and a driven gear 84. The driven gear 84 is connected to a shaft 70 in a rotationally fixed manner and drives this shaft upon a rotation of the drive motor 72. Two gears 78, 80 are connected to this shaft 70 in a rotationally fixed manner, wherein the gear 80 is hidden behind a basic plate 76 of the gear unit 74 and is thus not visible in FIG. 2. The first gear 78 engages with the teeth of a first gear segment 68 formed along a circular arc about the axis of rotation 40, and the second gear 80 engages with the teeth of a second gear segment 69 formed along a circular arc about the axis of rotation 40. The two gear segments 68, 69 are connected to the display unit 12 so that the display unit 12 is tilted upward about the axis of rotation 40 in a first direction of rotation when the drive motor 72 is rotated in a first direction of rotation and so that the display unit 12 is tilted downward about the axis of rotation 40 in a second direction of rotation opposite to the first direction of rotation when the drive motor 72 is rotated in a second direction of rotation opposite to the first direction of rotation.

The maximum possible tilt angle from a rest position of the display unit 12 (referred to as home position) is preferably 10° in both directions. In other embodiments, the tilt angle can be varied between 0° and 15° in one or in both directions. Embodiments in which, starting out from the home position, the possible variation of the tilt angle in both directions is different, for example 10° in one direction and 15° in the other direction, are likewise possible. The home position is the position taken by the display unit 12 when the device 10 has not been used within a preset amount of time.

A user can manually change the tilt angle of the display unit 12 by means of the operating element 28. As long as the user presses the area of the operating element 28 identified with the pictogram 30, the display unit 12 is tilted upward in the first direction of rotation by means of the drive unit 34, whereas by pressing the area identified with the pictogram 32 the display unit 12 is tilted downward in the second direction of rotation by means of the drive unit 34.

Figure 3:
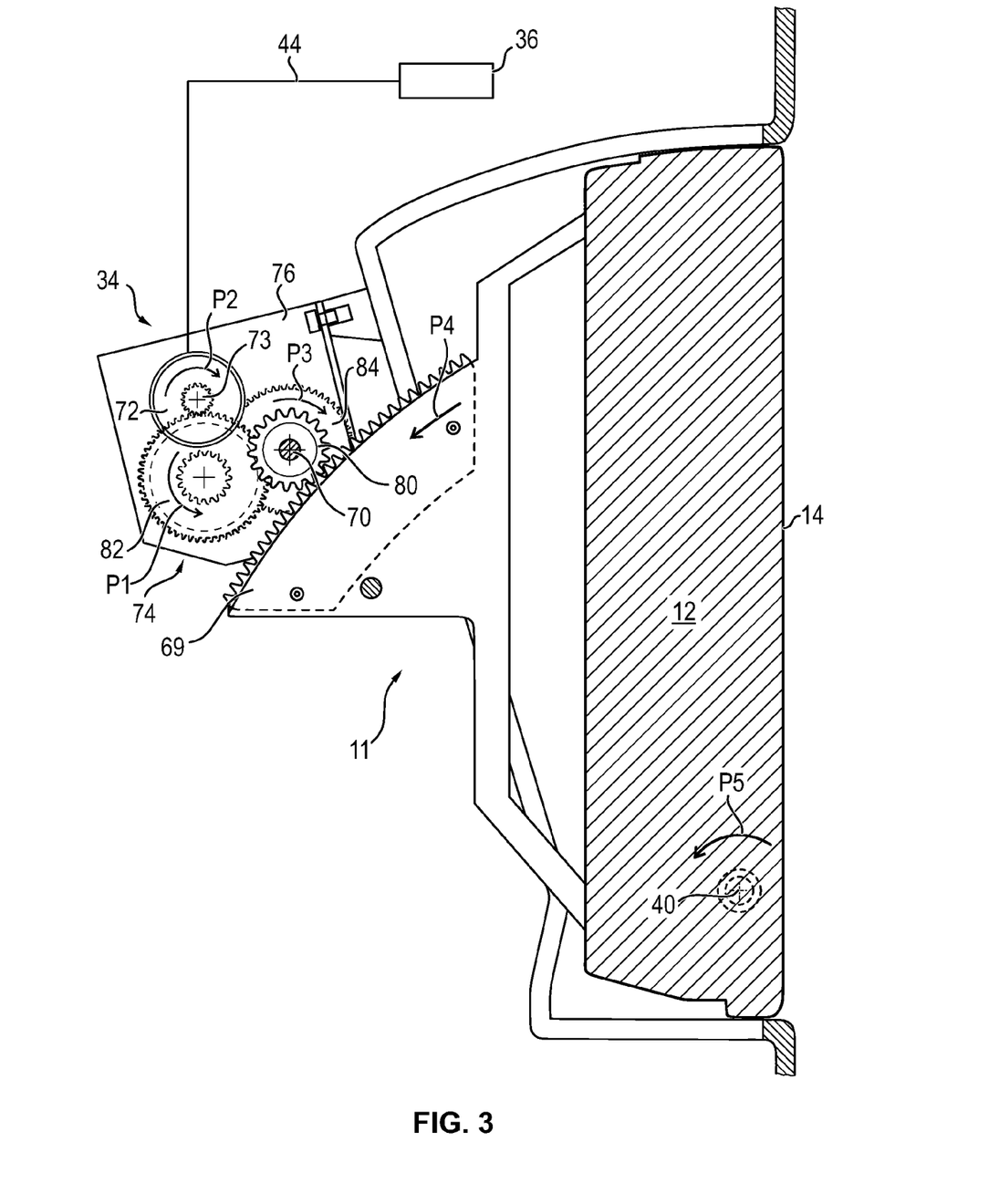
FIG. 3 shows a schematic cross-section of the arrangement through the cutting plane A-A in FIG. 2.

FIG. 3 shows a schematic cross-section of the arrangement 11 and of the control unit 36 through the cutting plane A-A illustrated in FIG. 2. In FIG. 3, housing parts 39 of the operating panel of the device 10 are additionally illustrated in cross-section. When a user presses the area of the operating element 28 identified with the pictogram 30, the control unit 36 tilts the display unit upward about the axis of rotation 40 in the first direction of rotation indicated by the arrow P5 in FIG. 3. For this, the drive motor 72 is connected to the control unit 36 via the electric line 44 so that the drive motor 72 drives the gear 73 connected thereto in a rotationally fixed manner in the direction of the arrow P2. As a result thereof, the stepped gear 82 of the gear unit 74 is rotated in the direction of the arrow P1, and the driven gear 84 of the gear unit 74 is rotated in the direction of the arrow P3. Thus, the shaft 70 connected to the driven gear 84 in a rotationally fixed manner and the gears 78, 80 connected to the shaft 70 in a rotationally fixed manner are likewise rotated in the direction of the arrow P3. As a result thereof, the gears 78, 80 drive the gear segments 68, 69 in the direction of the arrow P4 so that the gear segments 68, and the display unit 12 connected thereto are rotated about the axis of rotation 40 in the direction of the arrow P5.

Figure 4:
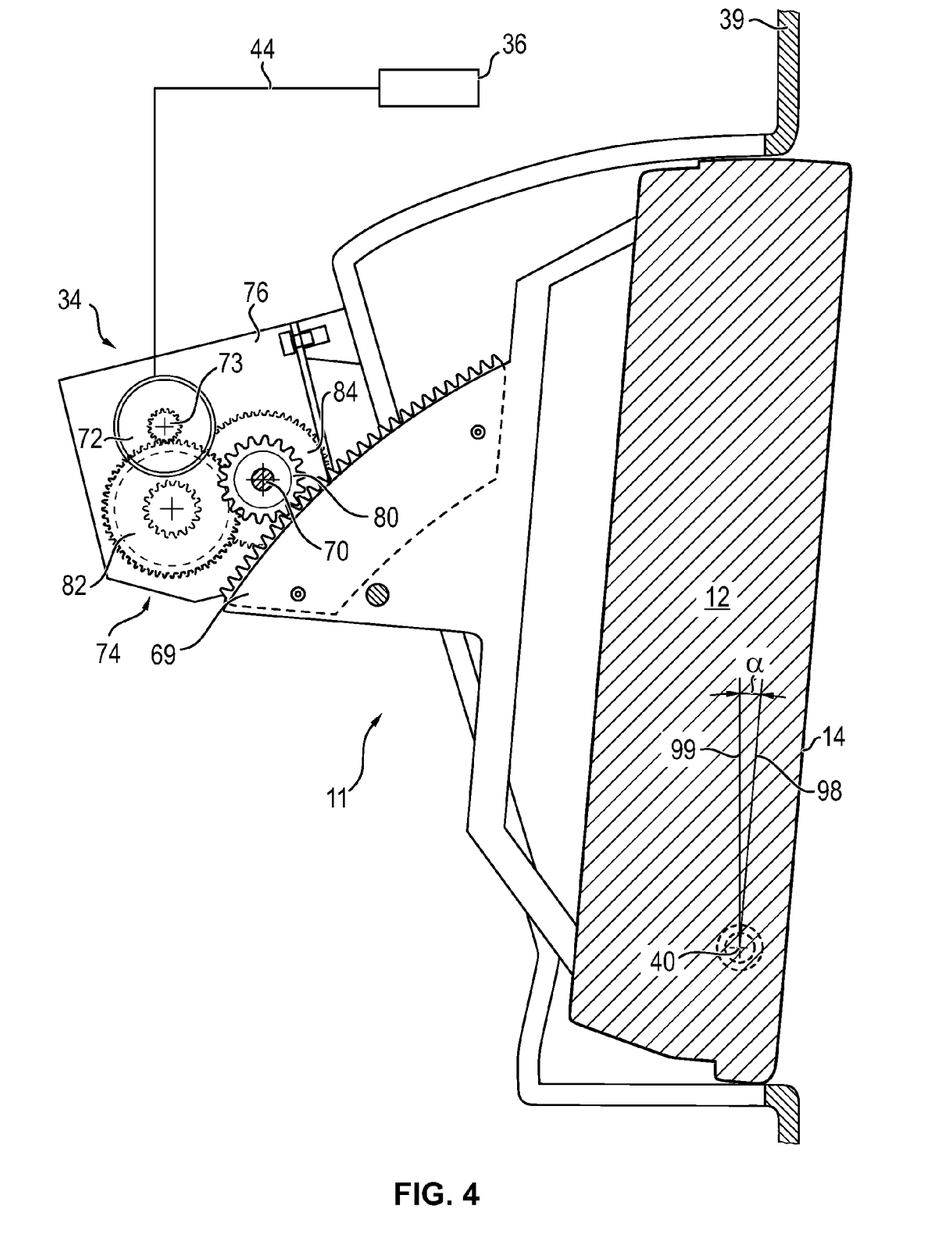
FIG. 4 shows a schematic cross-section of the arrangement according to FIG. 3, with the display unit tilted downward.

FIG. 4 shows a schematic cross-section of the arrangement 11 according to FIG. 3. Unlike in FIG. 3, the display unit 12 in FIG. 4 is tilted by a tilt angle α in the second direction of rotation opposite to the arrow P5 and thus downward. As a result thereof, also the gear segments 68, 69 connected to the display unit 12 are rotated about the axis of rotation 40 in a direction of rotation opposite to the arrow P5, as compared to the position shown in FIG. 3. In the position shown in FIG. 4, the display unit 12 can be well viewed for example by a user sitting in a vehicle or in a wheel chair.

For illustration of the tilt angle α, the legs 98, 99 forming the tilt angle α are illustrated in FIG. 4. The first leg 98 runs parallel to the display surface 14 in the position shown in FIG. 4 and the second leg 99 runs parallel to the position of the display surface 14 in the home position. In other embodiments, the positions of the legs 98, 99 of the tilt angle α can also be oriented differently. In particular, the leg 99 which indicates the tilt of the display plane in the home position can already have a position different from the vertical position so that in this case the display plane is already tilted upward or downward in the home position. Thus, the leg 99 indicates the position of the display plane of the display surface 14 in the home position and the other leg 98 indicates the position of the display plane of the display surface 14 in a position different from the home position. In other embodiments, the tilt angle α can also be referenced to a different plane.

Figure 5:
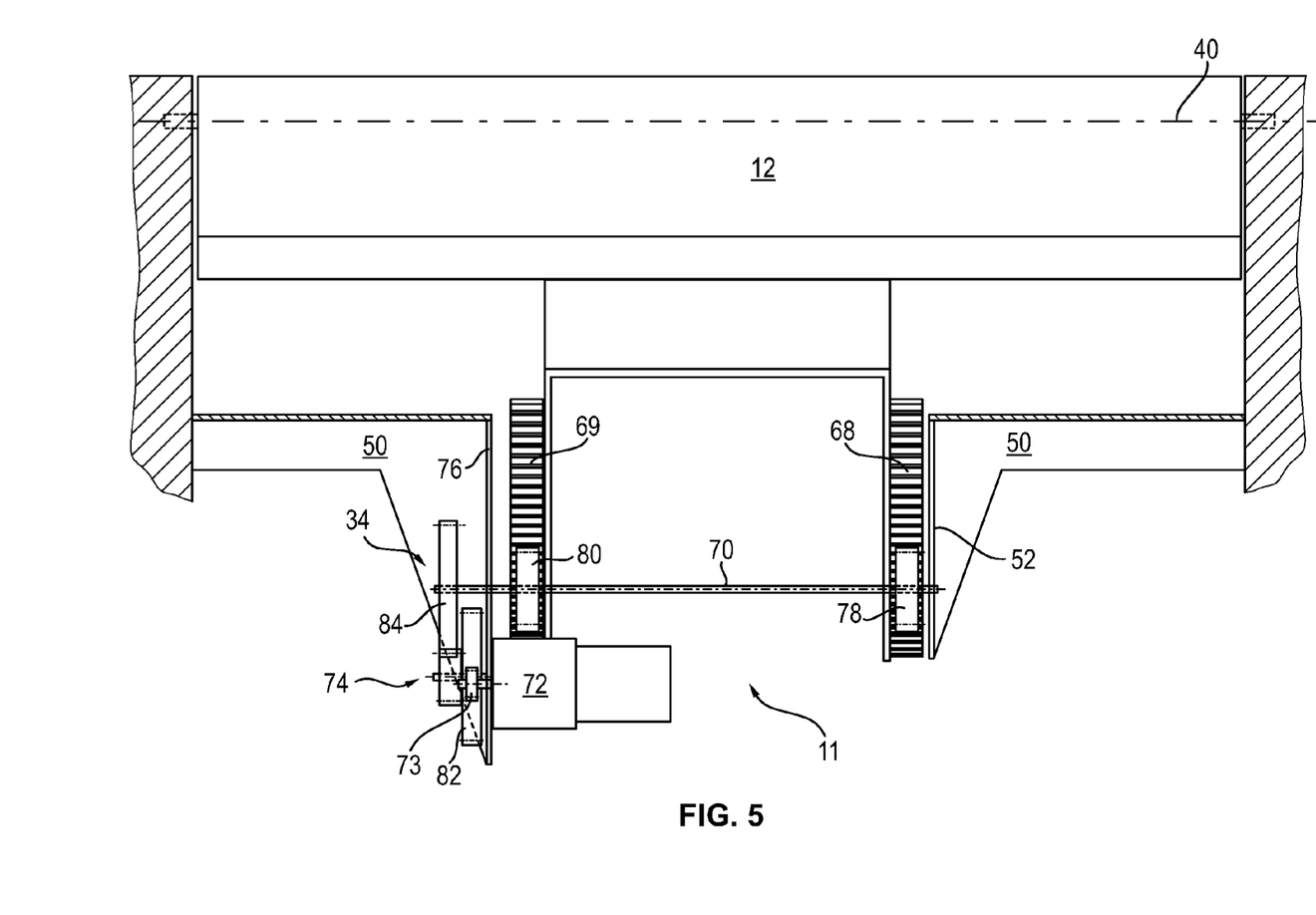
FIG. 5 shows a schematic cross-section of the device along the cutting line B-B in FIG. 1.

FIG. 5 shows a schematic cross-section of the device along the cutting line B-B illustrated in FIG. 1. The control unit 36 is not illustrated in FIG. 5 for better clarity. As described in connection with FIG. 2, the drive motor 72 drives the shaft 70 via the gear unit 74. Each of the two gears 78, 80 connected to the shaft 70 in a rotationally fixed manner engages with a respective gear segment 68, 69, as already explained in connection with FIG. 2.

The drive unit 34 is firmly connected to a basic frame of the device 10 via a carrier profile 50. In this embodiment, the basic plate 76 of the gear unit 74 is formed in one piece with the carrier profile 50 and supports the drive motor 72 and the gear unit 74. Via a non-illustrated bearing, the shaft 70 extending through the basic plate 76 is mounted in an area between the driven gear 84 and the gear 80. At the opposite end of the shaft 70, a second, non-illustrated bearing is provided by which the shaft 70 is mounted on a support plate 52. By means of the described arrangement 11, a change of the tilt of the display unit 12 is easily possible, the arrangement 11 having a simple structure and being low-maintenance.

In other embodiments of the arrangement 11, this arrangement comprises only one gear 80 and the gear segment 69, which makes the arrangement 11 even more compact. In further embodiments, more than two gears 78, 80 are provided on the shaft 70, each of which engaging with a gear segment 68, 69 connected to the display unit 12.

In another embodiment, the device 10 comprises a camera. By means of the camera of the device 10 an image of an area in front of the device 10 can be captured and image data corresponding to the image can be generated. The image data are then processed by means of the control unit 36 of the device. Here, a user in front of the device 10 is detected and a body feature of the user is detected, and the position of the body feature of the user is determined. Based on the position of the detected body feature, the control unit 36 determines a tilt angle of the display unit 12 that is suitable for the user and automatically adjusts this determined tilt angle. The body feature could be the face, the shoulder, the upper edge of the head, the hairline, and/or the eyes of the user.

What is claimed is:

1. A device for handling banknotes, comprising:
a display unit having a display surface for displaying at least one graphical user interface, the display unit being rotatably mounted about an axis of rotation for changing a tilt angle of the display surface, the axis of rotation remains stationary as the display unit rotates, the display unit comprising:
  a drive unit for rotating the display unit about the axis of rotation, the drive unit fixedly mounted to the device so as to not rotate with the display unit;
wherein:
  the display unit is connected to a gear segment formed along a circular arc, the gear segment is mounted on the display unit stationarily and in a rotationally fixed manner, the axis of rotation about which the display unit rotates extends through a center of curvature of the circular arc;
  a gear which is operatively connected to the drive unit engages with the teeth of the gear segment formed along the circular arc; and
  the device includes a control unit in which a home position tilt angle is stored in a preset manner, and in that after termination of an operating transaction, the control unit drives the display unit such that it moves the display unit to a home position defined by the home position tilt angle.

2. The device according to claim 1, wherein the device comprises at least one operating element by means of which the tilt angle can be adjusted.

3. The device according to claim 2, wherein the operating element comprises a first push button for driving the display unit about the axis of rotation in a first direction of rotation and a second push button for driving the display unit about the axis of rotation in a second direction of rotation opposite to the first direction of rotation.

4. The device according to claim 1 wherein the display unit has a rectangular display surface, the display surface having a first side with a first side length and a second side with a second side length, wherein the first side and the second side enclosing a right angle.

5. The device according to claim 4, wherein when the device is in the operating position, the first side is oriented horizontally.

6. The device according to claim 1 wherein along the second side of the display surface and/or along a third side of the display surface opposite to the second side, a plurality of push buttons for selecting control information displayed via the user interface are arranged.

7. The device according to claim 1 wherein when the device is in the operating position, the axis of rotation is oriented horizontally.

8. The device according to claim 1 wherein the display unit comprises a touch screen.

9. A device for handling banknotes comprising:
a display unit including a display surface configured to display at least one graphical user interface, the display unit rotatable about a fixed axis of rotation to change a tilt angle of the display unit;
a gear segment mounted to the display unit in a stationary and rotationally fixed manner, the gear segment including teeth and extending along a circular arc having a center of curvature;
a drive unit;
a gear engaged with the teeth of the gear segment, the gear configured to be driven by the drive unit to rotate the display unit about the axis of rotation to change the tilt angle, the drive unit and the gear are fixedly mounted to the device so as to not rotate with the display unit; and
a control unit configured to store a home tilt angle of the display unit, and configured to command the drive unit to return the display unit to the home tilt angle after a transaction has been completed during which the tilt angle of the display unit was changed by a user;
wherein the axis of rotation about which the display unit rotates extends through the center of curvature of the circular arc that the gear segment extends along.

10. The device of claim 9, further comprising a switch configured to be mounted to an operating panel of the device, the switch configured to be actuated by a user for changing the tilt angle.

11. The device of claim 9, further comprising a first push button and a second push button configured to be mounted to an operating panel of the device, actuation of the first push button rotates the display unit in a first direction and actuation of the second push button rotates the display unit in a second direction opposite to the first direction.

12. The device of claim 9, wherein the display unit includes a touch screen.

13. The device of claim 9, wherein the gear segment includes a first gear segment spaced apart from a second gear segment.

14. A device for handling banknotes comprising:
a camera configured to capture an image of an area in front of the device and generate image data corresponding to the image captured;

a display unit including a display surface configured to display at least one graphical user interface, the display unit rotatable about a fixed axis of rotation to change a tilt angle of the display unit;

a gear segment mounted to the display unit in a stationary and rotationally fixed manner, the gear segment including teeth and extending along a circular arc having a center of curvature, the axis of rotation about which the display unit rotates extends through the center of curvature of the circular arc that the gear segment extends along;

a drive unit;

a gear engaged with the teeth of the gear segment, the gear configured to be driven by the drive unit to rotate the display unit about the axis of rotation to change the tilt angle, the drive unit and the gear are fixedly mounted to the device so as to not rotate with the display unit; and a control unit configured to process the image data and detect a body feature of a user of the device, based on a position of the body feature detected the contrtol unit determines a tilt angle of the display unit that is suitable for the user and rotates the display unit to the tilt angle.

15. The device of claim 14, wherein the body feature is at least one of a face, a shoulder, an upper edge of a head, a hairline, an eye, and a pair of eyes.

16. The device of claim 14, wherein the control unit is configured to store a home tilt angle of the display unit, and configured to command the drive unit to return the display unit to the home tilt angle after a transaction has been completed during which the tilt angle of the display unit was changed by the user.

17. The device of claim 14, further comprising a switch configured to be mounted to an operating panel of the device, the switch configured to be actuated by the user for changing the tilt angle.

18. The device of claim 14, further comprising a first push button and a second push button configured to be mounted to an operating panel of the device, actuation of the first push button rotates the display unit in a first direction and actuation of the second push button rotates the display unit in a second direction opposite to the first direction.

19. The device of claim 14, wherein the gear segment includes a first gear segment laterally spaced apart from a second gear segment.

20. The device of claim 14, wherein the axis of rotation is proximate to a bottom of the display unit.

* * * * *